United States Patent
Sakurai

(10) Patent No.: US 6,600,440 B1
(45) Date of Patent: Jul. 29, 2003

(54) CAPACITOR MISMATCH INDEPENDENT GAIN STAGE FOR PIPELINE ANALOG TO DIGITAL CONVERTERS

(75) Inventor: Satoshi Sakurai, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 18 days.

(21) Appl. No.: 09/930,810

(22) Filed: Aug. 15, 2001

(51) Int. Cl.[7] .............................. H03M 1/12; H03M 1/38
(52) U.S. Cl. ......................... 341/172; 341/155; 341/161
(58) Field of Search ................................. 341/161, 155, 341/172, 120, 118

(56) References Cited

U.S. PATENT DOCUMENTS

| | | | |
|---|---|---|---|
| 5,710,563 A | 1/1998 | Vu et al. ..................... | 341/161 |
| 5,784,016 A * | 7/1998 | Nagaraj ..................... | 341/161 |
| 6,028,546 A * | 2/2000 | Signell et al. ............... | 341/161 |
| 6,097,326 A * | 8/2000 | Opris et al. .................. | 341/161 |
| 6,124,818 A * | 9/2000 | Thomas et al. ............. | 341/155 |
| 6,137,431 A * | 10/2000 | Lee et al. .................... | 341/161 |
| 6,211,805 B1 | 4/2001 | Yu .............................. | 341/155 |
| 6,211,806 B1 | 4/2001 | McCarroll .................. | 341/161 |
| 6,222,471 B1 | 4/2001 | Nagaraj ....................... | 341/120 |
| 6,232,898 B1 | 5/2001 | Nagaraj ....................... | 341/120 |
| 6,295,016 B1 * | 9/2001 | Chiang ........................ | 341/161 |
| 6,366,230 B1 * | 4/2002 | Zhang et al. ................ | 341/161 |

OTHER PUBLICATIONS

Lewis, S. et al., "A 10–b 20–Msample / s Analog–to–Digital Converter;" *IEEE Journal of Solid–State Circuits* 27:3 (Mar. 1992), pp. 351–358.

* cited by examiner

*Primary Examiner*—Jean Bruner JeanGlaude
(74) *Attorney, Agent, or Firm*—Merchant & Gould; Jamie Wiegand

(57) ABSTRACT

A method and apparatus are arranged for minimizing the effects of capacitor mismatch errors in pipelined analog-to-digital converters (ADC). The virtual elimination of capacitor mismatch effects is achieved without trading comparator offset margin by an appropriate selection of comparator circuits' reference signals and the inclusion of a plurality of capacitors that are switched into an appropriate feedback position. The appropriate feedback position in the switched capacitor amplifier circuit is determined based on the operating region. For each of k pipeline stage, a method includes: determining an operating region of a sampled analog input signal for a predetermined transfer curve, and computing digital code bits and an improved residue signal for this stage based on the determined operating region, and then computing a final conversion code from the digital code bits of the k pipeline stages.

16 Claims, 11 Drawing Sheets

SWITCH (SW) MODE

| | | 1 | 2 | 3 | 4 | 5 | 6 | 7 | 8 | 9 | 10 | 11 | 12 | 13 |
|---|---|---|---|---|---|---|---|---|---|---|---|---|---|---|
| LOGIC MODE | SAMPLE | X | | | | | X | | | | X | X | X | X |
| | Hold $D_i = -1$ | | | | | X | | | X | X | | | | |
| | Hold $D_i = 0$ | | | | X | | | X | X | | | | | |
| | Hold $D_i = 1$ | | X | X | X | | | | | | | | | |

*Fig. 5.*

CAPACITOR MISMATCH INDEPENDENT GAIN STAGE FOR PIPELINE ANALOG TO DIGITAL CONVERTERS

FIELD OF THE INVENTION

The present invention related to the field of analog to digital converters, and in particular, to a method and apparatus directed to multistage pipelined analog to digital converters with improved performance when subject to capacitor mismatches.

BACKGROUND OF THE INVENTION

An analog-to-digital converter (ADC) is a device that takes an analog data signal and converts it into a digital code, i.e. "digitizes" the analog signal. Since the mid-1970's analog-to-digital converters have employed a variety of architectures, such as the integrating, successive-approximation, flash, and the delta-sigma architectures. Recently, the pipelined analog-to-digital converter (ADC) has become a popular ADC architecture for use in high-speed applications such as CCD imaging, ultrasonic medical imaging, digital videos, cable modems, and fast Ethernets. Pipelined ADCs are typically chosen because of their high accuracy, high throughput rates, and low power consumption. Moreover, the pipeline architecture generally provides better performance for a given power and die area than other ADC architectures.

An example of a conventional k-stage pipelined ADC (100) is shown in FIG. 1. As shown in the figure, the conventional k-stage pipelined ADC (100) includes an array of k gain stages (102) and a decoder logic circuit (104). Each of the gain stages (102) is connected in series to the previous gain stage (102). Each gain stage (102) is also connected to the decoder logic circuit (104).

In operation, an analog input voltage ($V_{in}$) is provided to the first gain stage (102). The first gain stage (102) samples the analog input voltage ($V_{in}$) and converts it to a first digital coefficient ($n_1$). The first coefficient ($n_1$) is processed by the decoder logic circuit (104) to provide the Most Significant Bit (MSB) of a digital data representation of the analog input voltage ($V_{in}$). The first gain stage (102) also converts the first digital coefficient ($n_1$) back to an analog representation. The analog representation is subtracted from the sampled analog input voltage ($V_{in}$) and multiplied by a gain multiplier to provide a "residue" voltage. The residue voltage ($V_{res}(1)$) from the first gain stage (102) becomes the analog input voltage to the next gain stage (102) of the pipeline. That is, $V_{in}(2)=V_{res}(1)$. The residue voltage ($V_{res}(i)$) continues through the pipeline of gain stages (102), providing another digital coefficient ($n_i$) based on the digital representation of the input to that gain stage, as described above.

The overall digital representation of the analog voltage input ($V_{in}$) is obtained by concatenating the k digital coefficients ($n_1$ through $n_k$) from the array of k gain stages (102) through the decoder logic circuit (104).

Digital error correction logic is typically used to improve the accuracy of conversions by providing overlap between the quantization ranges of adjacent gain stages (102) in the pipeline. An architecture that makes use of this correction to a 1-bit per stage pipeline ADC is a 1.5-bit per stage pipeline topology.

FIG. 2 is a graph illustrating ideal transfer characteristics of a 1.5-bit per stage conventional pipeline ADC such as illustrated in FIG. 1. In the 1.5-bit architecture, there are two thresholds or transition points in the transfer curve, resulting in three operating regions. Each stage of the 1.5-bit architecture effectively converts only one bit of information. The extra region (as compared to a 1-bit per stage topology) is used for redundancy. That is, the extra bit of information is combined with the digital outputs from subsequent gain stages (102) in the pipeline to generate another bit.

As shown in FIG. 2, the input voltage ($V_{in}$) appears along the x-axis and illustrates that the resolvable input range of the ADC is given by: $-V_{ref} < V_{in} < +V_{ref}$.

Two transition points appear along the x-axis. The first transition point occurs at $V_{in}$ equal to $-V_{ref}/4$ and the second transition point occurs at $V_{in}$ equal to $V_{ref}/4$. The two transition points divide the operating range for the input voltage ($V_{in}$) into three operating regions, where two bits (00, 01, and 10) of the digital output of each stage characterize the entire range. Further, the slope of each curve reflects the gain multiplier employed in the gain stage (102) of FIG. 1.

Operationally, the gain stage (102) examines the input ($V_{in}(i)$) and determines whether the input is less than the first transition point, $-V_{ref}/4$. If $V_{in}(i)$ is less than the first transition point ($-V_{ref}/4$) then the digital code output for the gain stage (102) is 00. Similarly, a digital output code of 01 is generated for $V_{in}(i)$ between the first transition point, $-V_{ref}/4$, and the second transition point ($V_{ref}/4$). If $V_{in}(i)$ is greater than the second transition point, $V_{ref}/4$, the ideal transfer characteristics generates a digital output code of 10.

Moreover, the output residue voltage ($V_{res}(i)$) is generated by the following transfer function:

$$V_{res}(i) = 2^M \cdot V_{in}(i) - D_i \cdot V_{ref} \qquad \text{(EQ 1)}$$

where M is the number of effective bits that are being generated by stage i, $2^M$ represents the gain multiplier for the gain stage (102), and $D_i$ is a constant determined by the digital representation of the analog input voltage ($V_{in}$), having possible values of –1, 0, and 1. For the 1.5-bit per stage ADC, the number of effective bits (M) is one. The output residue voltage ($V_{res}(i)$) generated at the $i^{th}$ gain stage (102) becomes the analog input voltage ($V_{in}(i+1)$) to the next gain stage (102).

SUMMARY OF THE INVENTION

The present invention is directed to a method and apparatus that produces a pipelined analog-to-digital converter (ADC) with improved linearity for a given capacitor mismatch, while retaining comparator offset margins. A capacitor circuit is selectively switched into the feedback position of a switched capacitor amplifier circuit depending on the region of operation of an input signal in a pipeline stage. There is a one-to-one correspondence between the number of capacitor circuit to be employed in the feedback and a given number of operating regions. An appropriate selection of comparator circuits' reference signals is employed to retain comparator offset margin, while reducing the linearity errors resulting from capacitor mismatch.

In accordance with one embodiment of the present invention, an apparatus is directed to producing digital output signals from an analog input signal in a pipelined stage that includes a sample mode and a hold mode. The apparatus includes a first capacitor circuit, a second capacitor circuit, a third capacitor circuit, a comparator circuit, an amplifier circuit, and first and second selection circuits. The first capacitor circuit is coupled to the analog input signal during the sample mode such that the first capacitor circuit is charged by the analog input signal. The second capacitor circuit is coupled to the analog input signal during the sample mode such that the second capacitor circuit is charged by the analog input signal. The third capacitor circuit is coupled to a circuit ground potential during the sample mode such that the third capacitor is discharged. The comparator circuit is coupled to the analog input signal, and first and second sampling reference signals that are preselected to minimize transition height errors, the comparator circuit providing an output code in response to the analog input signal and the first and second sampling reference signals, wherein the output code correspond to one of at least three operating regions for the analog input signal during the sample mode. The amplifier circuit is coupled to the first, second, and third capacitance circuits during the hold mode. The first selection circuit is arranged to couple a selected one of the first, second, and third capacitance circuits between an input and an output of the amplifier circuit in response to the output code during the hold mode. The second selection circuit is arranged to couple the other of the capacitor circuits between a respective hold reference signal and the input of the amplifier circuit, wherein the hold reference signals and the selected capacitor are determined by the output code, and the output of the amplifier circuit during the hold mode corresponds to a residue signal in a pipelined converter.

The apparatus above can be extended by further including a fourth capacitor circuit and a third sampling reference signal. The fourth capacitor circuit is coupled to the circuit ground potential during the sample mode such that the fourth capacitor is discharged. The third sampling reference signal is coupled to the comparator circuit, wherein the comparator circuit is arranged to provide an output code in response to the analog input signal, and the first, second and third sampling reference signals such that the output code corresponds to one of at least four operating regions for the analog input signal during the sample mode. The first selection circuit is arranged to couple a selected one of the first, second, third and fourth capacitance circuits between an input and an output of the amplifier circuit in response to the output code, and the second selection circuit is arranged to couple the other of the capacitor circuits between a respective hold reference signal and the input of the amplifier circuit, wherein the hold reference signals and the selected capacitor are determined by the output code, and the output of the amplifier circuit during the hold mode corresponds to a residue signal in a pipelined converter.

In accordance with another embodiment of the invention, a method is directed converting an analog input signal to a conversion code, in a converter with multiple pipelined stages. The method includes sampling the analog input signal from one of the analog input signal and an improved residue signal from a preceding one of the pipelined stages to produce a sampled analog signal, comparing the sampled analog signal to transition points on a transfer curve, wherein the transition points are arranged to partition an analog input range into multiple operating regions, providing a digital code in response to the comparison between the sampled analog signal and the transition points such that the digital code corresponds to a selected one of the multiple operating regions, producing an improved residue signal in response to the digital code and the sampled analog input signal such that the improved residue signal corresponds to a point along the transfer curve in the selected one of the multiple operating regions, and computing the conversion code from the digital codes from each stage in the pipelined converter, such that offset margins in the transfer curve that occur at the transition points are retained, and transition height errors that occur at the transition points are eliminated.

In yet another embodiment of the invention, circuit is directed to minimizing the effects of capacitor mismatch errors in a conversion code generated by a k-pipelined analog to digital converter in response to an analog input signal. The circuit includes k pipeline stages and a decoder logic circuit. The k pipeline stages are arranged in sequence such that an input signal to each subsequent pipeline stage is provided by a residue signal from a preceding pipeline stage. Each pipeline stage includes a plurality of capacitors, a comparison circuit, an amplifier circuit, wherein one of the plurality of capacitors is selectively switched into a feedback position of the amplifier circuit, the comparison circuit is arranged to produce a plurality of digital code bits, and the amplifier provides the residue signal in response to the input signal such that the plurality of digital code bits correspond to an operating region of the input signal, and a plurality of transition points define the operating regions such that transition height errors that occur from capacitor mismatches are minimized. The decoder logic circuit is arranged to produce a conversion code in response to the plurality of digital code bits from each of the k pipeline stages.

A more complete appreciation of the present invention and its improvements can be obtained by reference to the accompanying drawings, which are briefly summarized below, to the following detail description of presently preferred embodiments of the invention, and to the appended claims.

BRIEF DESCRIPTION OF THE DRAWINGS

FIG. 5 is a switching table illustrating switch configurations for the switching circuit shown in FIG. 4;

DETAILED DESCRIPTION OF THE PREFERRED EMBODIMENT

Figure 1:
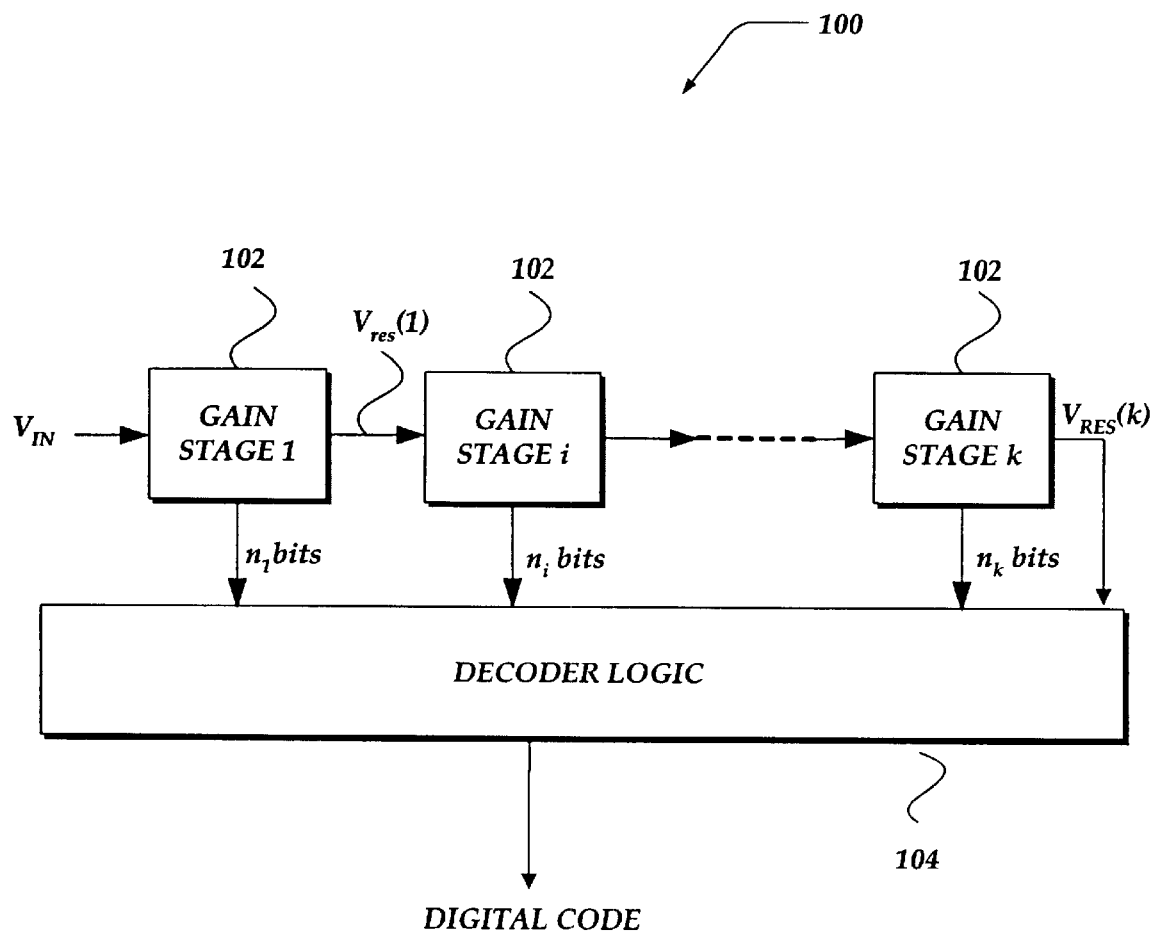
FIG. 1 is a schematic block diagram illustrating a conventional architecture of a pipelined analog-to-digital converter (ADC)
Figure 2:
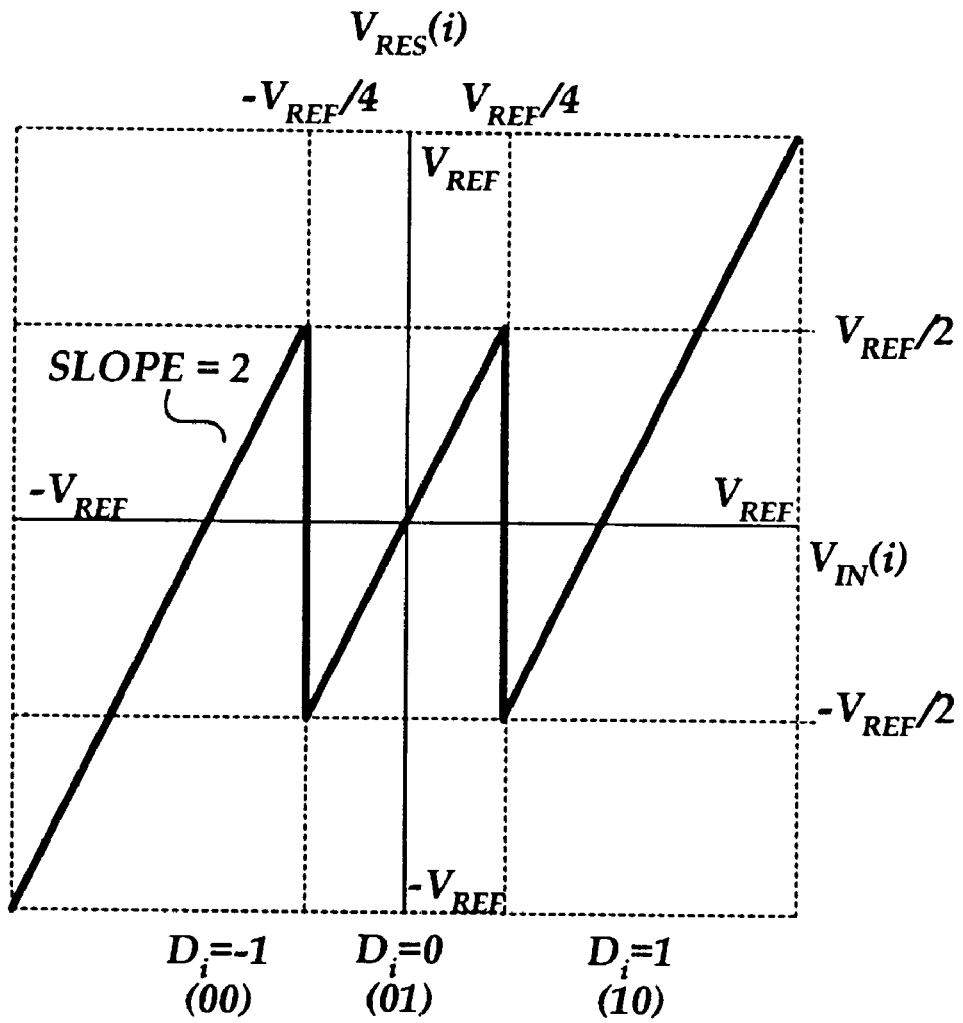
FIG. 2 is a schematic diagram illustrating an ideal transfer curve for a conventional 1.5-bit per stage structure of FIG. 1.

In the following detailed description of exemplary embodiments of the invention, reference is made to the accompanied drawings, which form a part hereof, and which are shown by way of illustration, specific exemplary embodiments of which the invention may be practiced. These embodiments are described in sufficient detail to enable those skilled in the art to practice the invention, and it is to be understood that other embodiments may be utilized, and other changes may be made, without departing from the spirit or scope of the invention. The following detailed description is, therefore, not to be taken in a limiting sense, and the scope of the invention is defined only by the appended claims. Referring to the drawings, like numbers indicate like parts throughout the views.

Throughout the specification, and in the claims, the term "connected" means a direct electrical connection between the things that are connected, without any intermediary devices. The term "coupled" means either a direct electrical connection between the things that are connected, or an indirect connection through one or more passive or active intermediary devices. The term "circuit" means one or more passive and/or active components that are arranged to cooperate with one another to provide a desired function. The term "signal" means at least one current signal, voltage signal or data signal. The meaning of "a", "an", and "the" include plural references. The meaning of "in" includes "in" and "on."

The present invention relates to a pipelined Analog-to-Digital Converter (ADC) architecture that is directed at reducing the effect of nonlinearity errors due to capacitor mismatches in the pipeline stage without giving up comparator offset margin.

Figure 3:
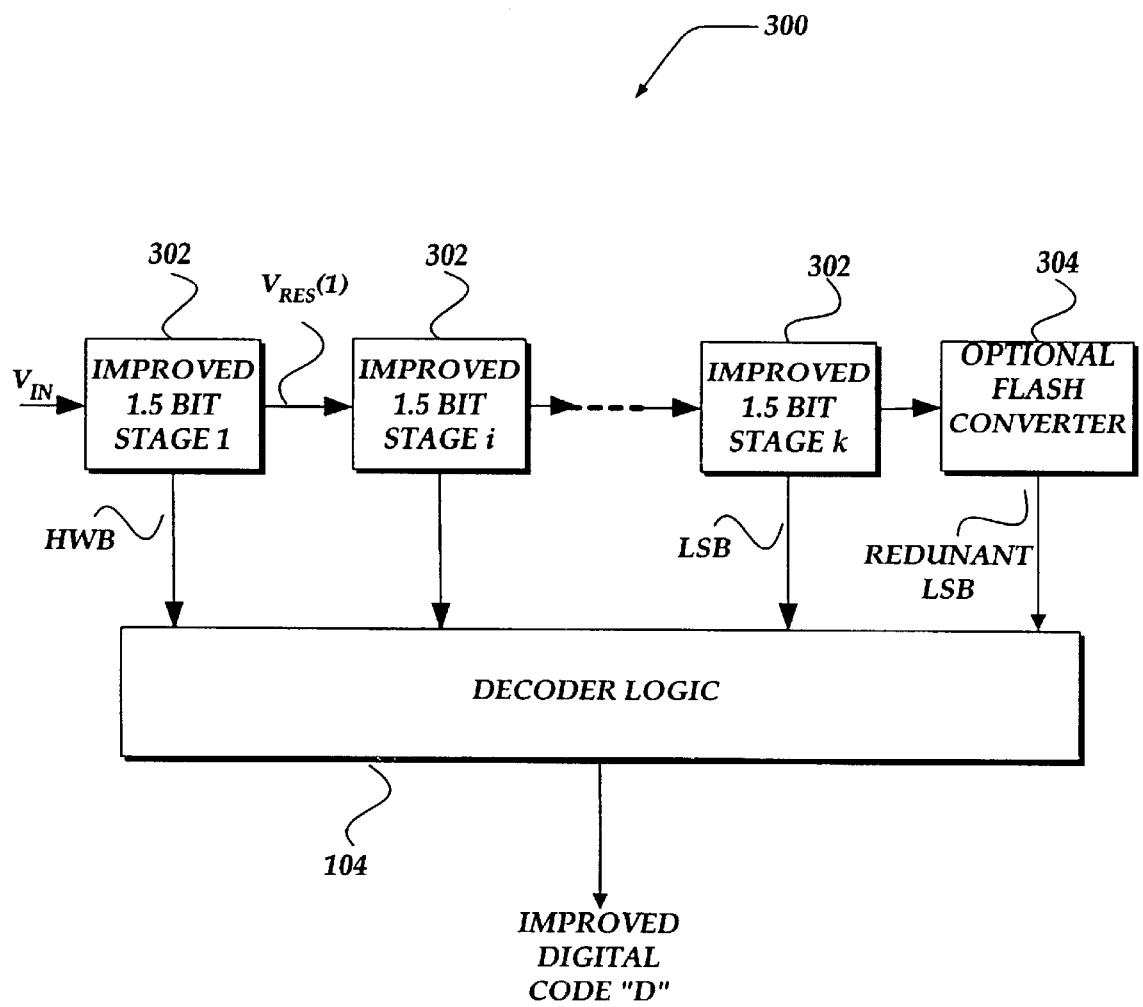
FIG. 3 is a schematic diagram of an exemplary embodiment.

FIG. 3 is a schematic diagram illustrating a first example of an improved 1.5-bit per stage pipeline ADC in accordance with the present invention. As will be described in more detail below, the present invention has identified that capacitors and comparators found in ADCs may cause digital conversion errors. Capacitors may introduce nonlinearity errors because of a mismatch of capacitance between the capacitors employed in the circuit. Comparators may introduce additional errors that appear as offset errors in the reference signals. The new pipeline ADC (300) employs improved 1.5-bit gain stages (302) that are directed at minimizing the errors in digital conversions that arise due to capacitor mismatches in a circuit, without giving up comparator offset error margins.

The new pipeline ADC (300), shown in FIG. 3, includes an array of k improved 1.5-bit gain stages (302), an optional flash converter (304), and a decoder logic circuit (104).

In FIG. 3, each improved 1.5-bit gain stage (302) is coupled in series to the next improved 1.5-bit gain stage (302). The $k^{th}$ improved 1.5-bit gain stage (302) is coupled to the optional flash converter (304). Each of the k improved 1.5-bit gain stages (302) are also coupled to the decoder logic circuit (104). In addition, the optional flash converter (304) also is coupled to the decoder logic circuit (104).

In operation, stage one of the improved 1.5-bit gain stage (302) receives an analog input signal ($V_{in}$) to be quantized. The analog input signal ($V_{in}$) is often a time varying analog signal. The 1.5-bit gain stage (302) includes a sample and hold circuit that is used to periodically store the analog signal at an instant of time corresponding to a sampling frequency. The new pipeline ADC (300) employs the stored analog signal as the analog input signal during the conversion cycle. It is understood and appreciated that slow time varying input signals may not require a sample and hold circuit (i.e., the conversion time is an order of magnitude faster than the fastest frequency component of the time varying analog input signal). For the purposes of the discussion below, the sampled analog input signal or the "raw" analog input signal is referred to simply as the analog input signal ($V_{in}$).

Stage one of the improved 1.5-bit gain stage (302) quantizes the sampled analog input signal ($V_{in}$) to three levels, where one of the levels may be employed for redundancy. The quantized signal of the first stage of the improved 1.5-bit gain stage (302) provides the higher weight bits (HWB) to the decoder logic (104). Additionally, the improved 1.5-bit gain stage (304) converts the quantized signal to an analog representation (not shown). The analog representation is subtracted from the sampled analog input signal ($V_{in}$) and the result is multiplied by a factor of two $2^M$, M=1) to provide a residue signal ($V_{res}$) that is passed to the next improved 1.5-bit gain stage (302) for further conversions. As described earlier, the analog input signal ($V_{in}$) for subsequent stages is the residue signal ($V_{res}$) of the prior stage. This process continues for each stage of the new pipeline ADC (300) until the optional flash converter (304). The optional flash converter (304) receives, as its input signal, the residue signal ($V_{res}(k)$) from the $k^{th}$ improved 1.5-bit gain stage (302). The optional flash converter (304) converts the residue signal ($V_{res}(k)$) into the redundant least significant bits. The redundant least significant bits are provided to the decoder logic (104), which produces an improved digital code "D."

Figure 4:
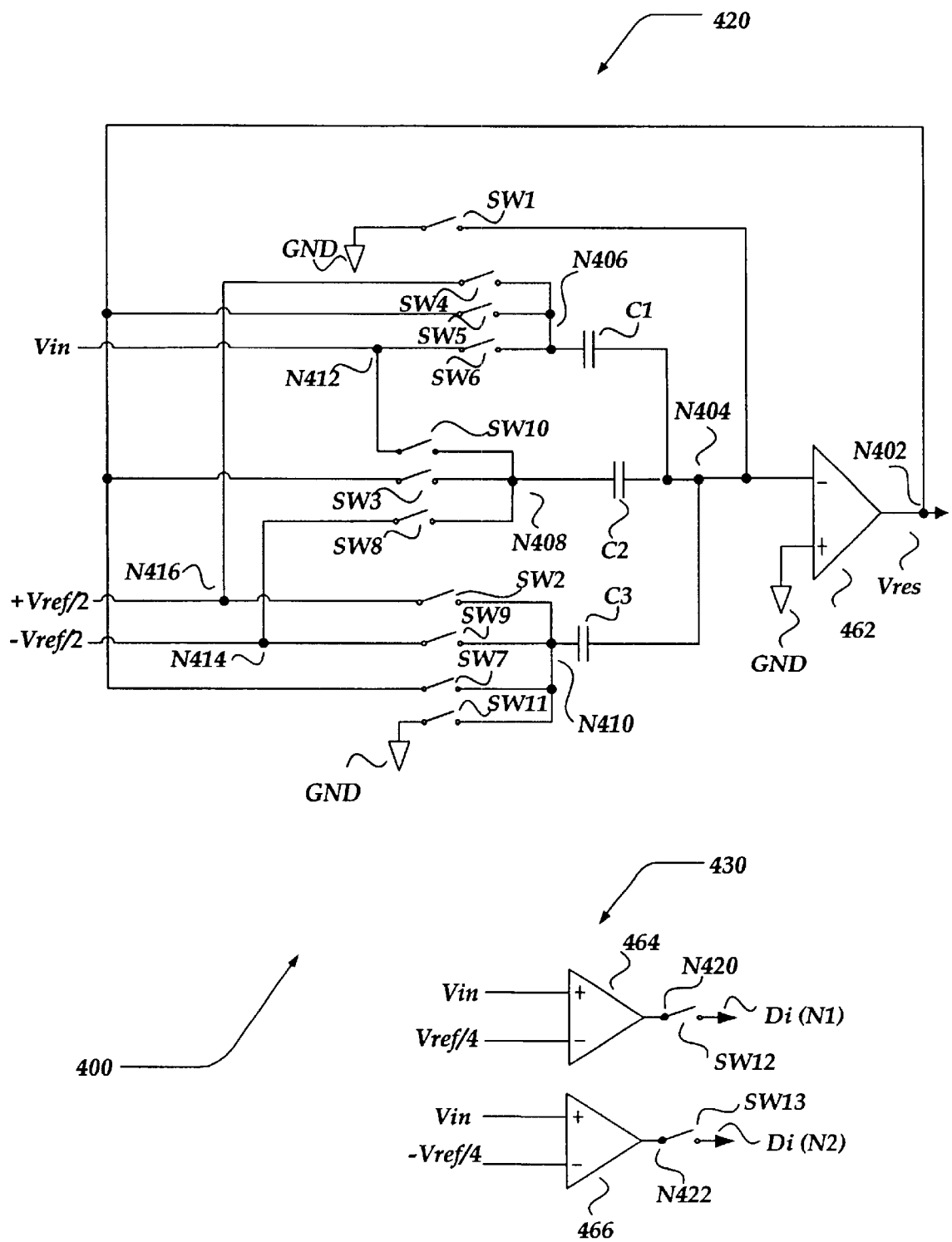
FIG. 4 is a schematic diagram illustrating switching circuit for the exemplary embodiment shown in FIG. 3.

FIG. 4 illustrates a possible implementation of a multiplying digital to analog converter (DAC) switching circuit (400) for the present invention shown in FIG. 3. The multiplying DAC switching circuit (400) includes of an interstage amplifier section (420) and a comparator section (430) for the improved 1.5-bit gain stage (302).

The interstage amplifier section (420) includes an amplifier circuit (462), an array of switching circuits (SW1-SW11), a first capacitor circuit (C1), a second capacitor circuit (C2), and a third capacitor circuit (C3). The capacitor circuits (C1–C3) are selected to have approximately the same capacitance values. However, as will be described in more detail below, the present invention improves the analog-to-digital conversion results even when there is a mismatch in the capacitance values.

The first capacitor (C1) is coupled between nodes N406 and N404. The second capacitor (C2) is coupled between nodes N408 and N404. The third capacitor is coupled between nodes N410 and N404. The amplifier circuit (462) is coupled on its inverting input to node N404. The amplifier circuit's (462) non-inverting input is coupled to a circuit ground potential (GND). The output of the amplifier circuit (462) is coupled to node N402.

Switching circuit SW1 is coupled between node N404 and a circuit ground potential (GND). Switching circuit SW4 is coupled between nodes N416 and N406. Switching circuit SW5 is coupled between nodes N402 and N406. Switching circuit SW6 is coupled between nodes N412 and N406. Switching circuit SW10 is coupled between nodes N412 and N408. Switching circuit SW3 is coupled between nodes N402 and N408. Switching circuit SW8 is coupled between nodes N414 and N408. Switching circuit SW2 is coupled between nodes N416 and N410. Switching circuit SW9 is coupled between nodes N414 and N410. Switching circuit SW7 is coupled between nodes N402 and N410. Switching circuit SW11 is coupled between the circuit ground potential (GND) and node N410.

The comparator section (430) includes two comparator circuits (464 and 466) and two switching circuits (SW12–SW13). The analog input signal ($V_{in}$) is coupled to a non-inverting input of the comparator circuit (464). A reference signal of $V_{ref}/4$ is coupled to an inverting input of the comparator circuit (464). An output of the comparator circuit (464) is coupled through node N420 to switching circuit (SW12).

Additionally, the analog input signal ($V_{in}$) is coupled to a non-inverting input of the comparator circuit (466). A reference signal of $-V_{ref}/4$ is coupled to an inverting input of the comparator circuit (466). An output of the comparator circuit (466) is coupled through node N422 to the switching circuit (SW13).

The switching circuits SW12–SW13 are intended to illustrate latching of the output signals at the end of the sampling mode for the comparator section (430) described in detail below. The switching circuits SW12 and SW13 and are not representative of physical switching circuits.

Moreover, it will be appreciated by those of ordinary skill in the art that the operating modes illustrated in FIG. 4 may be implemented in a variety of ways. For example, the operating modes of FIG. 4 may be implemented as an open loop sampling circuit, a closed loop sampling circuit, or other electronic circuit arrangements that provide a sample mode and a hold mode, without departing from the scope or spirit of the invention.

The reference signals may be generated by any appropriate method, and the method employed should not be construed as limiting the scope of the invention. For example, the reference signals may be generated by a series of resistor circuits coupled between a high reference and a low reference signal, a band gap reference, or any other type of reference generator without departing from the spirit or scope of the invention.

Generalized Operation

The multiplying DAC switching circuit (400) illustrated in FIG. 4 has two operating modes, a sample mode, and a hold mode. The hold mode further includes three sub-modes. The sub-modes are determined by the range of the sampled analog input signal ($V_{in}$) as will be described in more detail below.

The multiplying DAC switching circuit (400) in FIG. 4 is generally operated with two non-overlapping clock signals (not shown). A first clock signal determines the sampling mode's time period, while a second signal determines the hold modes' time period. During operation, the clock signals determine which of the switching circuits (SW1–SW13) are open and closed.

In describing the operation of the multiplying DAC switching circuit (400) illustrated in FIG. 4, reference will be made to the switch configuration table shown in FIG. 5. Each switching circuit that is in a closed state is designated by an "X," while a switching circuit that is in an open state is designated by an empty entry in the table. When a switching circuit is in the closed state, signals flow through the switch. An "open switching circuit" isolates signals such that signals do not flow through the switching circuit.

The operation of the sample and hold modes will be discussed below with reference to FIGS. 4 and 5.

First Operating Mode (Sample Mode)

In the first operating mode, switching circuits SW1, SW6, and SW10–SW13 are closed and an analog input signal ($V_{in}$) is continuously sampled. Additionally, the analog input signal ($V_{in}$) is compared to reference signal values ($-V_{ref}/4$ and $V_{ref}/4$) to provide two digital code bits ($D_i(N1)$ and $Di(N2)$).

The capacitor circuits (C1–C3) are coupled to the circuit ground potential (GND) through switching circuit SW1. The third capacitor circuit (C3) is discharged through switching circuits SW1 and SW11. Moreover, the first and second capacitor circuits (C1 and C2) are coupled to the analog input signal ($V_{in}$) such that they "follow" the input signal.

Operationally, when the comparator circuit (464) of the comparator section (430) determines that the analog input signal ($V_{in}$) is less the reference signal level, $V_{ref}/4$, the first digital code bit ($D_i(N1)$) will be set to 0. If the analog input signal ($V_{in}$) is greater than the $V_{ref}/4$, the first digital code bit ($D_i(N1)$) will be set to 1. Similarly, the comparator circuit (466) will compare the analog input signal ($V_{in}$) to the reference signal level $-V_{ref}/4$ to determine the value of the second digital code bit ($D_i(N2)$). Additionally, the two digital code bits ($D_i(N1,N2)$) will be combined to produce a signed coefficient ($D_i$).

When the analog input signal ($V_{in}$) is less than $-V_{ref}/4$, the comparator section (430) will generate the two digital code bits ($D_i(N1,N2)$) of 00, and $D_i=-1$. When the analog input signal ($V_{in}$) is between $-V_{ref}/4$ and $V_{ref}/4$, the comparator section (430) will generate the two digital code bits ($D_i(N1,N2)$) of 01, and $D_i=0$. Moreover, when the analog input signal ($V_{in}$) is greater than $V_{ref}/4$, the comparator section (430) will generate the two digital code bits ($D_i(N1,N2)$) of 10, and $D_i=1$. The value of signed coefficient ($D_i$) will be employed to determine which of the three submodes of the hold operating mode is exercised.

Second Operating Mode (Hold Modes)

In the second operating mode of the multiplying DAC switching circuit (400) switching circuits SW1, SW6, and SW10–SW13 are open. When SW6 and SW10 are opened, capacitors C1 and C2 hold the sampled analog input signal ($V_{in}$). The positions of the switching circuits (SW2–SW5, SW7–SW8) are determined by the value of the signed coefficient ($D_i$), as will be discussed below.

Hold Submode for $D_i=-1$

In one hold submode, the analog input signal ($V_{in}$) is less than the reference signal $-V_{ref}/4$, as indicated by $D_i=-1$. As shown in FIG. 5, switching circuits SW5, SW9, and SW8 are closed, and the remaining switching circuits are open. The first capacitor circuit (C1) is coupled to the output of the amplifier circuit (462) through switching circuit SW5. The second capacitor circuit (C2) is coupled to reference signal $-V_{ref}/2$ through switching circuit SW8. The third capacitor circuit (C3) also is coupled to $-V_{ref}/2$ through switching circuit SW9.

Operationally, the reference signal $-V_{ref}/2$ provides a signal to the second and third capacitor circuits (C2, C3) through switching circuits SW8 and SW9, respectively. The second and third capacitor circuits (C2, C3) produces a gain that is set by capacitor ratios determined by C2/C1 and C3/C1. The first capacitor circuit (C1) provides a feedback path for the output residue signal ($V_{res}$) of the amplifier circuit (462) to the summing junction at node N404.

As the third capacitor (C3) was shorted to ground during the sample mode, only the first and second capacitor circuits (C1, C2) provide the sampled analog input signal ($V_{in}$) (factored by a capacitor ratio) to the amplifier circuit's (462) inverting input through node N404.

The output signal of the amplifier circuit (462) at node N402 is the residue signal ($V_{res}$) of the improved 1.5-bit gain stage (302). The residue signal ($V_{res}$) for this stage is used as the analog input signal ($V_{in}$) to the next stage of the new pipeline ADC (300) in FIG. 3.

Hold Submode for $D_i=0$

In this hold submode, the analog input signal ($V_{in}$) is between the reference signals $-V_{ref}/4$ and $V_{ref}/4$, as indicated by $D_i=0$. The switching circuits SW4, SW7, and SW8 are closed, and the remaining switching circuits are open. The third capacitor circuit (C3) is coupled to the output of the amplifier circuit (462) through switching circuit SW7. The first capacitor circuit (C1) is coupled to reference signal $+V_{ref}/2$ through switching circuit SW4. The second capacitor circuit (C2) is coupled to $-V_{ref}/2$ through switching circuit SW8.

Operationally, the reference signal $+V_{ref}/2$ provides a signal to the first capacitor circuit (C1) through switching circuit SW4. The reference signal $-V_{ref}/2$ provides a signal to the second capacitor circuit (C2) through switching circuit SW8. The first and second capacitor circuits (C1, C2) produces a gain set by capacitor ratios determined by C1/C3 and C2/C3. Additionally, the third capacitor circuit (C3) provides a feedback path for the output residue signal ($V_{res}$) of the amplifier circuit (462) to the summing junction at node N404.

As the third capacitor (C3) was shorted to ground during the sample mode, only the first and second capacitor circuits (C1, C2) provide the sampled analog input signal ($V_{in}$) (factored by a capacitor ratio) to the amplifier circuit's (462) inverting input through node N404.

The output signal of the amplifier circuit (462) at node N402 is the residue signal ($V_{res}$) of the improved 1.5-bit gain stage (302). The residue signal ($V_{res}$) for this stage is used as the analog input signal ($V_{in}$) to the next stage of the new pipeline ADC (300) in FIG. 3.

Hold Submode for $D_i=1$

In this submode, the analog input signal ($V_{in}$) is greater than the reference signals $V_{ref}/4$, as indicated by $D_i=1$. The switching circuits SW2, SW3, and SW4 are closed, and the remaining switching circuits are open. The second capacitor circuit (C2) is coupled to the output of the amplifier circuit (462) through switching circuit SW3. The first capacitor circuit (C1) is coupled to reference signal $+V_{ref}/2$ through switching circuit SW4. The third capacitor circuit (C3) also is coupled to $+V_{ref}/2$ through switching circuit SW2.

Operationally, the reference signal value of $+V_{ref}/2$ provides a signal to the first capacitor circuit (C1) through switching circuit SW4. The reference signal $+V_{ref}/2$ also provides a signal to the third capacitor circuit (C3) through switching circuit SW2. The first and third capacitor circuits (C1, C3) produces a gain set by a capacitor ratios determined by C1/C2 and C3/C2. Additionally, the second capacitor circuit (C2) provides a feedback path for the residue signal ($V_{res}$) of the amplifier circuit (462) to the summing junction at node N404.

As the third capacitor (C3) was shorted to ground during the sample mode, only the first and second capacitor circuits (C1, C2) provide the sampled analog input signal ($V_{in}$) (factored by a capacitor ratio) to the amplifier circuit's (462) inverting input through node N404.

The output signal of the amplifier circuit (462) at node N402 is the residue signal ($V_{res}$) of the improved 1.5-bit gain stage (302). The residue signal ($V_{res}$) for this stage is used as the analog input signal ($V_{in}$) to the next stage of the new pipeline ADC (300) in FIG. 3.

Another Embodiment of the Invention

Figure 6:
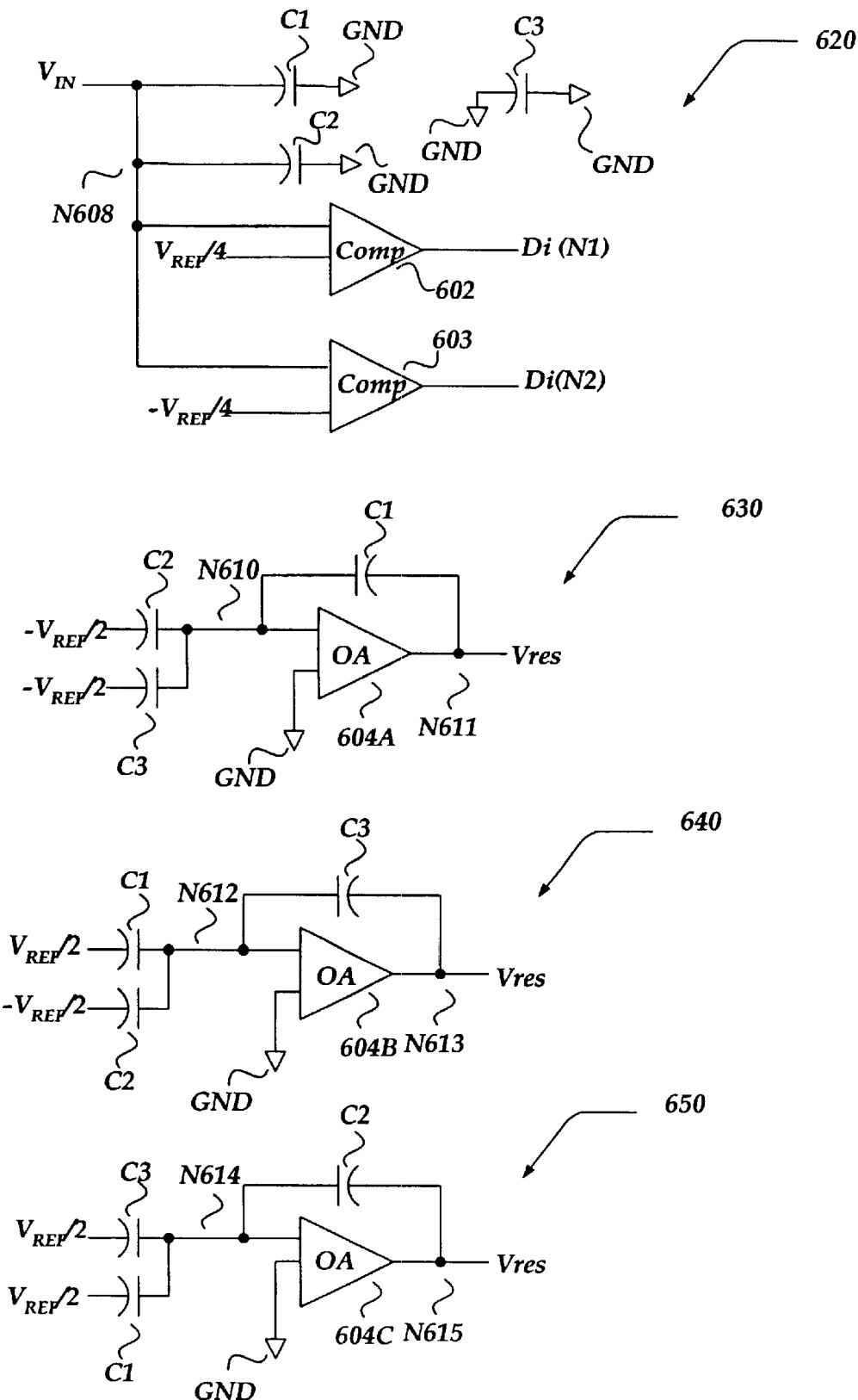
FIG. 6 is a schematic diagram illustrating the operation of an exemplary embodiment similar to FIG. 3.

FIG. 6 is a schematic diagram illustrating an example of one implementation of the improved 1.5-bit gain stage (302) shown in FIG. 3 in accordance with the present invention. Shown in FIG. 6 are a sampling circuit (620), a $D_i=-1$ hold submode circuit (630), a $D_i=0$ hold submode circuit (640), and a $D_i=1$ hold submode (650).

The sampling circuit (620) shown in FIG. 6 includes three capacitor circuits (C1–C3), and two comparator circuits (602 and 603). The first capacitor circuit (C1) is coupled between node N608 and a circuit ground potential (GND). The second capacitor circuit (C2) also is coupled to node N608 and a circuit ground potential (GND). The third capacitor circuit (C3) is coupled between two circuit ground potentials (GND).

The first comparator circuit (602) is coupled to node N608 at the non-inverting input side, and to a reference signal value Of $V_{ref}/4$ on the inverting input side. The second comparator circuit (603) similarly is coupled to node N608 at the non-inverting input side, and to a reference signal value of $-V_{ref}/4$ on the inverting input side.

The $D_i=-1$ hold submode circuit (630) shown in FIG. 6 includes three capacitor circuits (C1–C3), and an amplifier circuit (604A). The amplifier circuit (604A) is coupled between node N610 on its inverting input side and node N611 on its output side. The non-inverting input of the amplifier circuit (604A) is coupled to a circuit ground potential (GND). The first capacitor circuit (C1) is coupled between node N610 and node N611. The second and third capacitor circuits (C2, C3) are coupled between node N610 and a reference signal corresponding to $-V_{ref}/2$.

The $D_i=0$ hold submode circuit (640) shown in FIG. 6 includes three capacitor circuits (C1–C3), and an amplifier circuit (604B). The amplifier circuit (604B) is coupled between node N612 on its inverting input side and node N613 on its output side. The non-inverting input of the amplifier circuit (604B) is coupled to a circuit ground potential (GND). The third capacitor circuit (C3) is coupled between node N612 and node N613. The first capacitor circuit (C1) is coupled between node N612 and a reference signal corresponding to $V_{ref}/2$. The second capacitor circuit (C2) is coupled between node N612 and a reference signal corresponding to $-V_{ref}/2$.

The $D_i=1$ hold submode circuit (650) shown in FIG. 6 includes three capacitor circuits (C1–C3), and an amplifier circuit (604C). The amplifier circuit (604C) is coupled between node N614 on its inverting input side and node N615 on its output side. The non-inverting input of the amplifier circuit (604C) is coupled to a circuit ground potential (GND). The second capacitor circuit (C2) is coupled between node N614 and node N615. The first and third capacitor circuits (C1, C3) are coupled to node N614 and a reference signal corresponding to $V_{ref}/2$.

As will be appreciated by those of ordinary skill in the art, the circuits (620, 630, 640, and 650) shown in FIG. 6 may be arranged to share common components. For example, the capacitors (C1–C3) may be arranged to be shared by employing switching logic substantially similar to that illustrated in FIG. 4 and described above.

Additionally, it will be appreciated by those of ordinary skill in the art, that the operating modes illustrated in FIG. 6 may be implemented in a variety of ways. As disclosed by the present invention, the operating modes of FIG. 6 may be implemented by other electronic circuit arrangements that provide for a sample mode and a hold mode. For example, the operating modes of FIG. 6 may be implemented to be substantially similar to the operating modes described above for FIG. 4, without departing from the scope or spirit of the invention.

The circuits illustrated in FIG. 6 have two operating modes, a sample mode, and a hold mode. Only one of the four circuits (620, 630, 640, and 650) operate during any one period of time for a given gain stage.

During the sample mode, the sampling circuit (620) in FIG. 6 continuously samples an analog input signal ($V_{in}$) and compares it to reference signals ($\pm V_{ref}/4$) to provide digital code bits ($D_i(N1)$, $D_i(N2)$).

Operationally, the third capacitor circuit (C3) is fully discharged to the circuit ground potential (GND). The first and second capacitor circuits (C1, C2) are coupled to the analog input signal ($V_{in}$) such that they "follow" the input signal. The comparators (602 and 603) compare the analog input signal ($V_{in}$) to their respective reference signals ($V_{ref}/4$ or $-V_{ref}/4$) to generate the two digital code bits ($D_i$(N1) and $D_i$(N2)). The comparators (602 and 603) generate the two digital code bits ($D_i$(N1) and $D_i$(N2)) in a substantially similar manner to that illustrated in FIG. 4 and the accompanying above discussion.

The $D_i=-1$ hold submode circuit (630) operates substantially similar to the $D_i=-1$ hold submode described above and illustrated in FIG. 4. The $D_1=0$ hold submode circuit (640) operates substantially similar to the $D_i=0$ hold submode described above in FIG. 4 and related discussion. Furthermore, the $D_i=1$ hold submode circuit (650) operates substantially similar to the $D_i=1$ hold submode described above in FIG. 4.

It will be appreciated by those of ordinary skill in the art that the present invention is not limited to 1.5-bit per stage ADC architectures. For example, the pipeline stages can be configured by varying the number of bits each stage generates or by employing various number of gain stages for a given overall resolution requirement. As such, the present invention may be extended to gain stages generating any number of bits and thus any number of effective bits (multi-bit pipeline stages) without departing from the spirit or scope of the invention.

Features

The present invention has identified that errors may be introduced into the conversion process by mismatches in the capacitors (C1–C3) of the circuit and through signal offsets between the inverting and non-inverting inputs to the comparator circuits.

Figure 7:
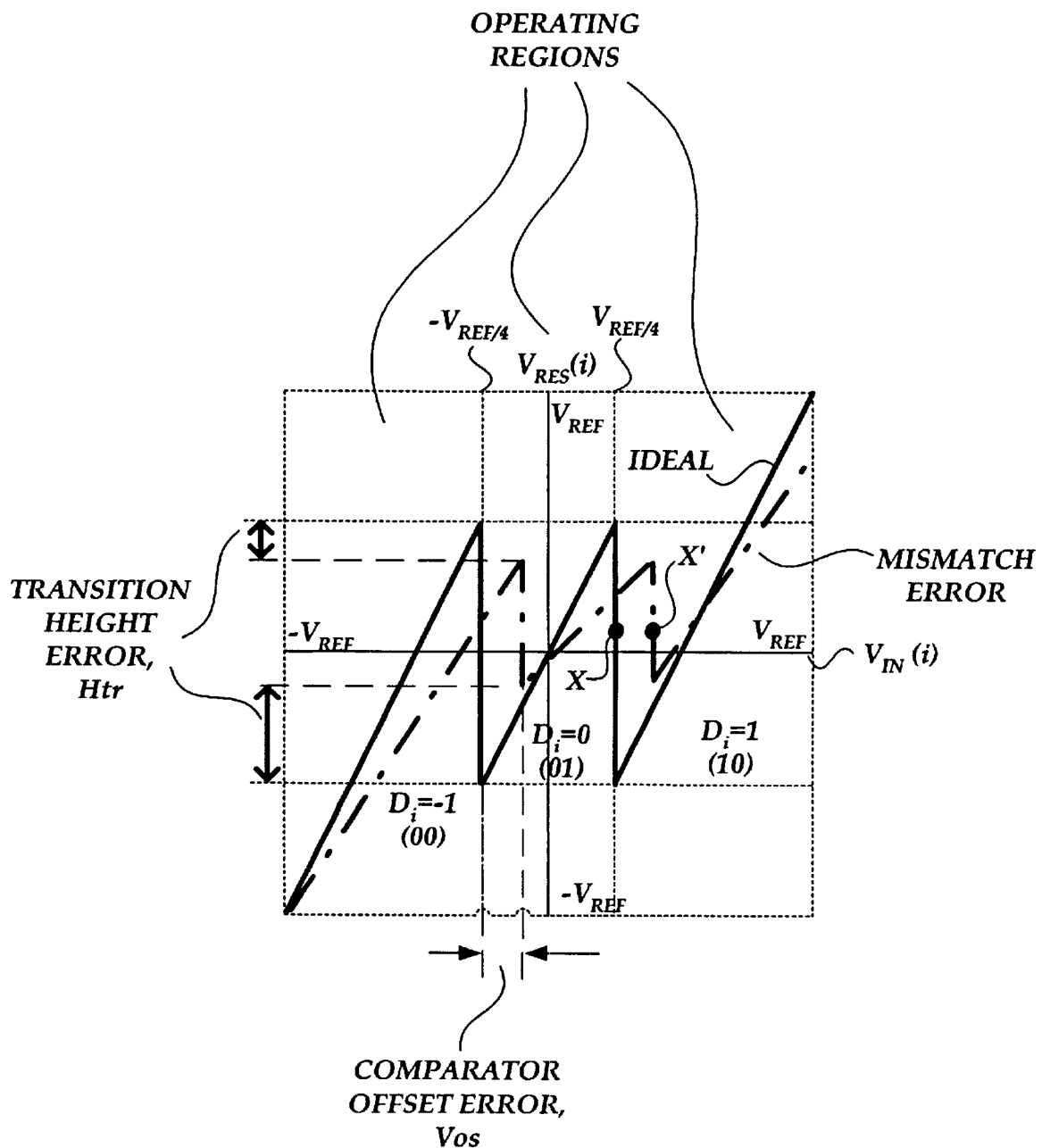
FIG. 7 is a schematic diagram illustrating comparator offset and transition height error for a 1.5 bit per stage pipelined analog-to-digital converter (ADC)

FIG. 7 illustrates a comparison between the ideal transfer characteristics of a improved 1.5-bit per stage pipeline ADC with transition points at $\pm V_{ref}/4$ and transfer characteristics of a 1.5-bit per stage pipeline ADC with comparator offset error and capacitor mismatch error. As shown in the figure, capacitor mismatches result in gain error that is illustrated as a non-ideal slope of the transfer curve. The gain errors typically result in loss of linearity for analog to digital conversions of the analog input signal ($V_{in}$). Capacitor mismatch also results in a transition height error (Htr) as shown in FIG. 7.

Comparator offset error is illustrated in FIG. 7 as a shift of the transition point. Such a shift in the transition point may result in loss of useful analog input range, again reducing the linearity for analog to digital conversions of the analog input signal ($V_{in}$). For example, as shown in FIG. 7, as point X shifts to point X', the $D_i=0$ operating region shifts, potentially at the expense, or loss, of the $D_i=1$ operating region. Thus, there may exist an increased likelihood that values of the analog input signal ($V_{in}$) will be incorrectly converted. Moreover, comparator signal offset error ($V_{os}$) in earlier gain stages in the pipeline may result in an accumulation of errors in later gain stages such that the gain stages "saturate." Saturation of a gain stage produces analog-to-digital conversion errors. The degree of offset that can be tolerated before linearity errors arise in the analog to digital conversions of the input signal is known as the comparator offset margin.

The present invention identifies a new approach to constructing a 1.5-bit stage with improved linearity. The present invention, however, has improved linearity without giving up the comparator offset margin. This may be seen by analyzing the transfer characteristics of the circuit shown in FIG. 6 for a given $D_i$.

For $D_i=-1$:

$$V_{res}=2\cdot V_{ref}(\Delta 1\cdot(-(V_{in}/V_{ref})-1)+\Delta 2\cdot((V_{in}/V_{ref})+\tfrac{1}{2})+\Delta 3\cdot \tfrac{1}{2}+1) \quad (EQ\ 2)$$

For $D_i=0$:

$$V_{res}=2\cdot V_{in}+V_{ref}(\Delta 1\cdot(V_{in}/V_{ref}-\tfrac{1}{2})+\Delta 2\cdot((V_{in}/V_{ref})+\tfrac{1}{2})-\Delta 3\cdot 2\ V_{in}/V_{ref}) \quad (EQ\ 3)$$

For $D_i=1$:

$$V_{res}=2\cdot V_{in}+V_{ref}(\Delta 1\cdot((V_{in}/V_{ref})-\tfrac{1}{2})+\Delta 2\cdot((-V_{in}/V_{ref})+1)-\Delta 3\cdot \tfrac{1}{2}-1) \quad (EQ\ 4)$$

where $\Delta 1$, $\Delta 2$, and $\Delta 3$ are given by $\alpha 1/C$, $\alpha 2/C$, and $\alpha 3/C$, respectively, for $C1=C+\alpha 1$, $C2=C+\alpha 2$, and $C3=C+\alpha 3$, representing mismatches in the respective capacitor circuits (C1–C3) from a single capacitance value of C. When the capacitance values for C1–C3 are perfectly matched (C1=C2=C3=C), the above equations (EQ 2–4) reduce to EQ 1 for the appropriate $D_i$, and M=1.

Errors in the transition height (Etr) can be obtained by subtracting the residue expressions from adjacent regions and then comparing it to the ideal height ($V_{ref}$). For the transition between $D_i=-1$ and $D_i=0$, $$Etr1=\Delta 31\cdot(2V_{in}+V_{ref}/2)/V_{ref}, \quad (EQ\ 5)$$

where $\Delta 31=\Delta 3-\Delta 1$ represents the capacitor mismatch between the third capacitor circuit (C3) and the first capacitor circuit (C1). Similarly, the error in transition height (Etr) for $D_i=0$ and $D_i=1$ is found as, $$Etr2=\Delta 23\cdot(2V_{in}-V_{ref}/2)/V_{ref}, \quad (EQ\ 6)$$

where $\Delta 23=\Delta 2-\Delta 3$ represents the capacitor mismatch between the second capacitor circuit (C2) and the third capacitor circuit (C3).

Figure 8:
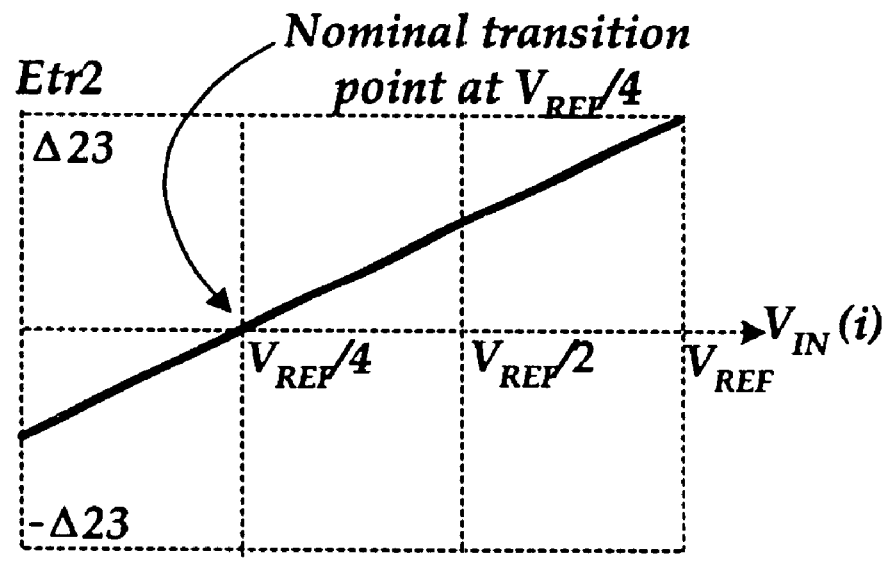
FIG. 8 is a graph illustrating transition error between $D_i=0$ and $D_i=1$ as a function of the location of the transition point.

When the transition points are kept at $\pm V_{ref}/4$, errors can be found by evaluating EQ 5 and EQ 6 at $\pm V_{ref}/4$. This results in Etr1=0 and Etr2=0, which shows that the transition errors are eliminated. FIG. 8 graphically illustrates EQ 6. The present invention, therefore, has effectively removed the transitions height errors (Htr) resulting from the capacitor mismatches. Even with a deviation in the transition point from the nominal location of $\pm V_{ref}/4$, a significant improvement is made.

FIG. 8 illustrates that the present invention has virtually eliminated the transition height error (Htr) introduced by the capacitor mismatches, while maintaining a wide margin for the offset in the transition points (comparator signal offset margin).

Other Embodiment of the Invention

Figure 9:
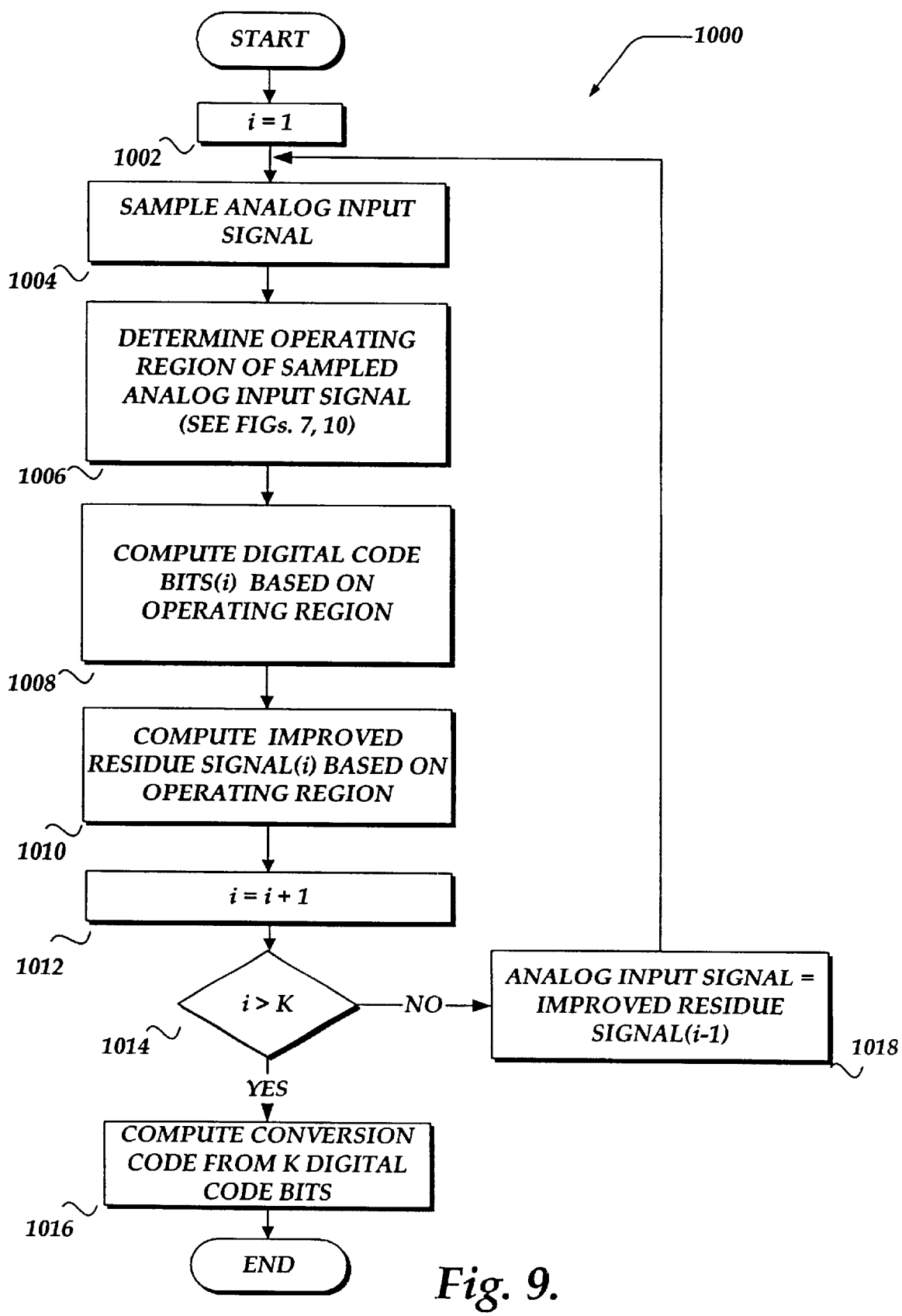
FIG. 9 is an operational logic diagram illustrating the operation of one embodiment.

FIG. 9 illustrates an operational logic diagram illustrating an operation of another embodiment. Briefly, the k-improved pipeline ADC process (1000) shown in the figure is directed at generating a conversion code that is a substantial digital equivalent of the sampled analog input signal ($V_{in}$).

As shown in FIG. 9, after a start block, the logic flows to block 1002 where a process stage counter (i) is initialized to one corresponding to the first stage of the k-improved pipeline ADC process (1000). The process then proceeds to block 1004.

At block 1004, an analog input signal ($V_{in}$) is sampled. The sampled analog input signal ($V_{in}$) is often an analog voltage signal. However, the invention is not limited to just sampling voltage signals. For example, the signal could be a current signal, without departing from the spirit or scope of the invention. The process then proceeds to block 1006 to determine an operating region of the analog input signal ($V_{in}$).

Figure 10:
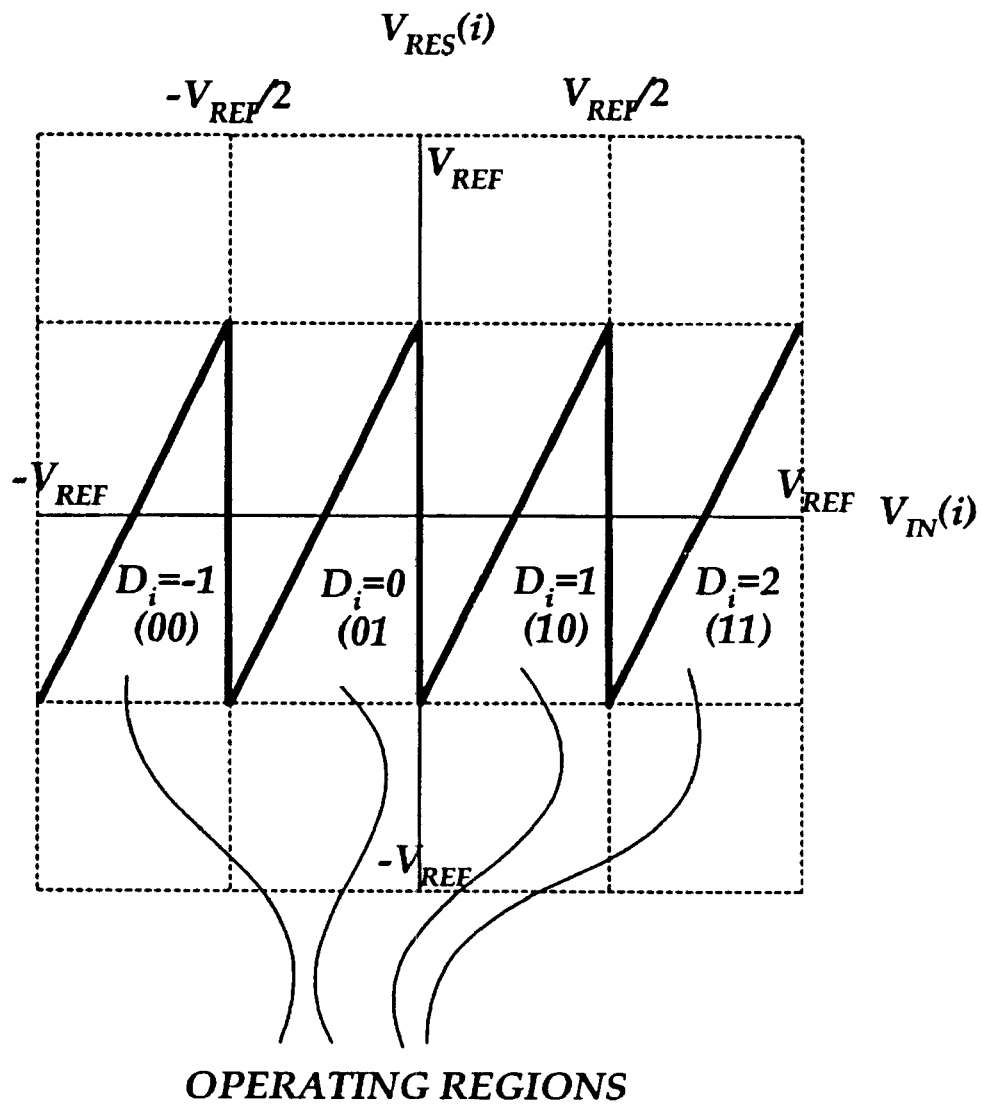
FIG. 10 is schematic diagrams illustrating a transfer curve for one gain stage of another embodiment of the invention.

At block 1006, the operating region of the sampled analog input signal ($V_{in}$) is determined by employing a transfer curve such as illustrated in FIGS. 7 and 10. When the transfer curve illustrated in FIG. 7 is employed, there are three operating regions. The operating region is determined by the location along the x-axis that corresponds to the sampled analog input signal ($V_{in}$).

A substantially similar process is employed at block 1006 when the transfer curve illustrated in FIG. 10 determines the operating region for the sampled analog input signal. As will be appreciated by those of ordinary skill in the art, the present invention is not limited to the transfer curves illustrated in FIGS. 7 and 10. For example, the operating region for the sampled analog input signal may be partitioned into any number of sub-regions without departing from the spirit or scope of the invention. Once the operating region is determined, the process proceeds to block 1008.

At block 1008, the determined operating region of the sampled analog input signal is employed to compute the digital code bits for stage (i) of the pipeline process. When the transfer curve illustrated in FIG. 7 was employed at block 1006, the digital code bits will also be determined from FIG. 7. For example, if it was determined that the operating region for the sampled analog input signal ($V_{in}$) was the first region, then the digital code bits will be set to 00. Similarly, if the transfer curve illustrated in FIG. 10 was employed at block 1006, then FIG. 10 will be employed to determine the digital code bits for stage (i). Upon determination of the digital code bits, the process continues to block 1010.

At block 1010, an improved residue signal ($V_{res}$) is computed for stage (i) of the process. The improved residue signal ($V_{res}$) corresponding to a value along the y-axis that corresponds to the point on the transfer curve of (x, y)=($V_{in}$, $V_{res}$). For example, when the transfer curve illustrated in FIG. 7 is employed, the improved residue signal ($V_{res}$) will be determined from the y-value corresponding to the sampled analog input signal ($V_{in}$). A substantially similar process is employed for the transfer curve illustrated in FIG. 10. After the improved residue signal ($V_{res}$) for stage (i) of the process is computed, the process proceeds to block 1012.

At block 1012, the process stage counter (i) is incremented. The process continues to decision block 1014, where it is determined if the process has exceeded the desired k stages for the k-improved pipeline ADC process (1000). When i is less than or equal to k, the process moves to block 1018, where the analog input signal ($V_{in}$) for the next loop of the process is set to the improved residue signal ($V_{res}$) (i−1) that was computed at block 1010. The process then proceeds to block 1004, to perform the above process steps for the remaining gain stages.

When it is determined at decision block 1014 that all of the gain stages have been processed (i>k), the process proceeds to block 1016. At block 1016, the one through k computed digital code bits are employed to compute a conversion code that is a substantial digital equivalent to the sampled analog input signal. The process then ends after block 1016.

FIG. 10 illustrates a transfer curve of another embodiment of the present invention. In the figure, transition points were shifted to ±$V_{ref}$/2, and another transition point is included at $V_{in}$=0. This provides for comparator signal offset margins of ±$V_{ref}$/4. As FIG. 10 illustrates, there are four operating regions in the transfer curve range. Thus, this embodiment employs three comparator circuits, or three discrete comparison ranges. With a slope of the transfer curves remaining at 2=$2^M$, for M=1, the effective resolution of each gain stage (302) remains at one bit per stage.

As shown in the figure, the transition points occur at −$V_{ref}$/2 for $D_i$=−1 (00), 0 for $D_i$=0 (01), and $V_{ref}$/2 for $D_i$=1 (10). Analog input signals ($V_{in}$) greater than $V_{ref}$/2 generate $D_i$=2 (11).

Figure 11:
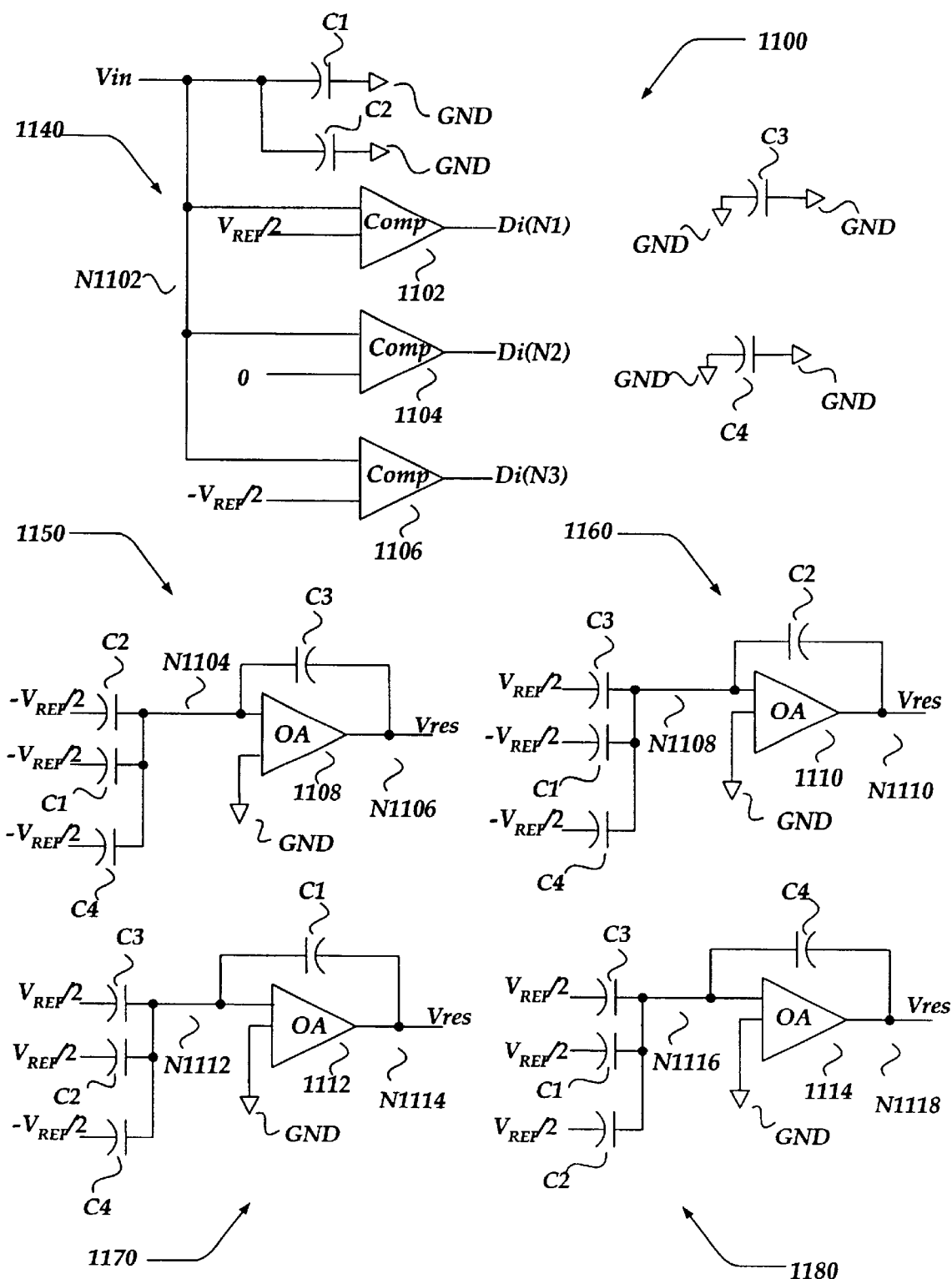
FIG. 11 is a schematic diagram illustrating another embodiment implementing the transfer curve of FIG. 10, in accordance with the present invention.

FIG. 11 illustrates a schematic diagram for an improved capacitor pipeline ADC (1100) as another embodiment of the improved 1.5-bit gain stage (302) shown in FIG. 3 with the transfer curve illustrated in FIG. 10.

As shown in the figure, the improved capacitor pipeline ADC (1100) includes a sampling circuit (1140), a $D_i$=−1 hold submode circuit (1150), a $D_i$=0 hold submode circuit (1160), a $D_i$=1 hold submode circuit (1170), and a $D_i$=2 hold submode circuit (1180). In this implementation, redundancy has been introduced by employing an additional comparator circuit (1106) in the sampling circuit (1140), and an additional capacitor circuit (C4) in the improved capacitor pipeline ADC (1100), such that each capacitor circuit (C1–C4) is selectively switched into a feedback position depending on the operating region of the pipeline stage.

The sampling circuit (1140) in FIG. 11 includes four capacitor circuits (C1–C4) and three comparator circuits (1102, 1104, and 1106). As shown in the figure, the first and second capacitor circuits (C1, C2) are coupled between node N1102 and circuit ground potential (GND). The third and fourth capacitor circuits (C3, C4) are shorted to circuit ground potential (GND) on each side.

The first comparator circuit (1102) is coupled between node N1102 on the non-inverting input and a reference signal corresponding to $V_{ref}$/2 on the inverting input. The second comparator circuit (1104) is coupled between node N1102 on the non-inverting input and a reference signal corresponding to 0 on the inverting input. The third comparator circuit (1106) is coupled between node N1102 on the non-inverting input and a reference signal corresponding to −$V_{ref}$/2 on the inverting input.

The $D_i$=−1 hold submode circuit (1150) includes four capacitor circuits (C1–C4), and an amplifier circuit (1108). The amplifier circuit (1108) is coupled to node N1104 on the inverting input, circuit ground potential (GND) on the non-inverting input, and to node N1106 on its output side. The third capacitor circuit (C3) is coupled between nodes N1104 and N1106. The first, second, and fourth capacitor circuits (C1, C2, and C4) are coupled between node N1104 and a reference signal value corresponding to −$V_{ref}$/2.

The $D_i$=0 hold submode circuit (1160) includes four capacitor circuits (C1–C4), and an amplifier circuit (1110). The amplifier circuit (1110) is coupled to node N1108 on the inverting input, circuit ground potential (GND) on the non-inverting input, and to node N1110 on its output side. The second capacitor circuit (C2) is coupled between nodes N1108 and N1110. The third capacitor circuit (C3) is coupled between node N1104 and a reference signal corresponding to $V_{ref}$/2. The first and fourth capacitor circuits (C1 and C4) are coupled between node N1108 and a reference signal corresponding to −$V_{ref}$/2.

The $D_i$=1 hold submode circuit (1170) includes four capacitor circuits (C1–C4), and an amplifier circuit (1112). The amplifier circuit (1112) is coupled to node N1112 on the inverting input, circuit ground potential (GND) on the non-inverting input, and to node N1114 on its output side. The first capacitor circuit (C1) is coupled between nodes N1112 and N1114. The third capacitor circuit (C3) is coupled between node N1112 and a reference signal of $V_{ref}/2$. The second and fourth capacitor circuits (C2 and C4) are coupled between node N1112 and C) a reference signal corresponding to $-V_{ref}/2$.

The $D_i=2$ hold submode circuit (1180) includes four capacitor circuits (C1–C4), and an amplifier circuit (1114). The amplifier circuit (1114) is coupled to node N1116 on the inverting input, circuit ground potential (GND) on the non-inverting input, and to node N1118 on its output side. The fourth capacitor circuit (C4) is coupled between nodes N1116 and N1118. The first, second, and third capacitor circuits (C1, C2, and C3) are coupled between node N1116 and a reference signal corresponding to $+V_{ref}/2$.

As will be appreciated by those of ordinary skill in the art, the subcircuits (1140, 1150, 1160, 1170, and 1180) of the improved capacitor pipeline ADC (1100) may be arranged to share common components. For example the amplifier circuits (1108, 1110, 1112, and 1114), reference signals ($V_{ref}$), and capacitor circuits (C1–C4), may all be arranged to be shared in a common circuit arrangement, without departing from the scope or spirit of the present invention. Moreover, a logic switching circuit substantially similar to that of FIG. 4 may be arranged to provide for the operation of the submodes of the improved capacitor pipeline ADC (1100) of FIG. 11.

The operation of the sampling circuit (1140) in FIG. 11 is substantially similar to the sampling circuit (620) in FIG. 6. However, the sampling circuit (1140) discharges two capacitor circuits (C3, C4) to ground during its operation and generates three digital code bits $D_i$(N1, N2, N3) based on the following comparisons (as illustrated in the transfer curve of FIG. 10):

$$D_i=2(11), \text{ for } V_{in}>V_{ref}/2,$$

$$D_i=1(10), \text{ for } V_{ref}/2>V_{in}>0,$$

$$D_i=0(00), \text{ for } 0>V_{in}>-V_{ref}/2, \text{ and}$$

$$D_i=-1(00), \text{ for } -V_{ref}/2>V_{in}.$$

Operationally, the first comparator circuit (1102) is directed at generating the first digital code bit ($D_i$(N1)), the second comparator circuit (1104) is directed at generating the second digital code bit ($D_i$(N2)), and the third comparator circuit (1106) is directed at generating a third digital code bit ($D_i$(N3)).

The operation of the hold submodes circuits in FIG. 11 are substantially similar to the hold submode circuits in FIG. 6. However, in FIG. 11, there is one additional hold submode, dividing the transition operating regions for the analog input signal ($V_{in}$) into four submodes rather than three as illustrated in FIG. 6.

The errors in transition heights (Etr) between adjacent operating regions may be determined by analyzing the improved capacitor pipeline ADC (1100) in FIG. 11, in a similar manner as above. For the transition between $D_i=-1$ and 0, $$Etr1=\Delta 23 \cdot (2V_{in}+V_{ref})/V_{ref} \quad (EQ\ 7)$$

where $\Delta 23=\Delta 2-\Delta 3$ represents the mismatch between the capacitor circuits C2 and C3. Similarly, for $D_i=0$ and $D_i=1$, $$Etr2=\Delta 12 \cdot 2V_{in}/V_{ref} \quad (EQ\ 8)$$

where $\Delta 12=\Delta 1-\Delta 2$ represents the mismatch between capacitor circuits C1 and C2. Additionally, for the transition between $D_i=1$ and $D_i=2$, $$Etr3=\Delta 14 \cdot (-2V_{in}+V_{ref})/V_{ref} \quad (EQ\ 9)$$

where $\Delta 14=\Delta 1-\Delta 4$ represents the mismatch between capacitor circuits C1 and C4.

Evaluating EQ 7, EQ 8, and EQ 9 at their nominal transition points of $-V_{ref}/2$, 0, and $V_{ref}/2$, respectively, the transition height error (Htr) is found to have been reduced to 0.

In the above illustrations, the switching circuits (SW1–SW11) have been illustrated using the simple toggle switch symbol. However, in light of the above disclosure, those skilled in the art will recognize that the invention is not limited to such implementation. For example, the switching circuits (SW1–SW11) could be implemented using a MOSFET, a BJT, a thyristor, GTOs, diode, or any other type of circuit that has a selectable conduction cycle and isolation cycle.

Moreover, the capacitor circuits (C1–C3, and C4) in the above illustrations were shown as separate capacitor circuits. In light of the above disclosure, however, those skilled in the art will recognize that the invention is not limited to such implementation. For example, the capacitor circuits (C1–C3, and C4) could be one or more capacitors that are arranged in parallel, series, a combination of parallel and series connections, or may consist of an electronic circuit arranged to operate as capacitor circuits. Moreover, the feedback capacitor circuit in the above illustrations could be arranged to provide a capacitance value different from the other capacitors in the embodiment.

While the above illustrations show single-ended implementations, the present invention is not so limited. For example, FIGS. 3, 4, 6, and 11 may be extended to fully differential implementations, without departing from the spirit or scope of the invention. That is, FIG. 3 may be extended to a differential implementation by including a negative analog input signal ($-V_{in}$), and a negative residue signal ($-V_{res}$). FIG. 4 may be extended to a differential implementation by including a negative analog input signal ($-V_{in}$), and replacing the amplifier circuit's (462) non-inverting input with substantially similar circuitry to that shown as providing the input to the amplifier circuit's (462) inverting input. Additionally, the amplifier circuit (462) would include a second output, negative residue signal ($-V_{res}$). Moreover, FIGS. 4, 6, and 11 may be extended in a similar manner.

The above specification, examples, and data provide a complete description of the manufacture and use of the composition of the invention. Since many embodiments of the invention can be made without departing from the spirit and scope of the invention, the invention resides in the claims hereinafter appended.

By way of illustration, one embodiment of an apparatus for producing digital output signals from a differential analog input signal in a pipelined converter that includes a sample mode and a hold mode, the differential analog input signal including a positive input signal ($+V_{in}$) and a negative input signal ($-V_{in}$) includes first, second, third, fourth, fifth, and sixth capacitor circuits (C1–C6). The first capacitor circuit (C1) is coupled to the differential analog input signal during the sample mode such that the first capacitor circuit (C1) is charged by the positive input signal ($+V_{in}$). The second capacitor circuit (C2) is coupled to the differential analog input signal during the sample mode such that the second capacitor circuit (C2) is charged by the positive input signal ($+V_{in}$). The third capacitor circuit (C3) is coupled to a circuit ground potential during the sample mode such that the third capacitor (C3) is discharged. The fourth capacitor circuit (C4) is coupled to the differential analog input signal during the sample mode such that the fourth capacitor circuit (C4) is charged by the negative input signal ($-V_{in}$). The fifth capacitor circuit (C5) is coupled to the differential analog input signal during the sample mode such that the fifth capacitor circuit (C5) is charged by the negative input signal ($-V_{in}$). The sixth capacitor circuit (C6) is coupled to a circuit ground potential during the sample mode such that the sixth capacitor (C6) is discharged.

The apparatus also includes a comparator circuit that is coupled to the differential analog input signal, and first and second sampling reference signals that are pre-selected to minimize transition height errors, the comparator circuit provides an output code in response to the differential analog input signal and the first and second sampling reference signals. The output code corresponds to one of at least three operating regions for the differential analog input signals during the sample mode. The apparatus further includes a differential amplifier circuit that includes a first input, a second input, and first and second outputs that are arranged to provide a positive residue signal ($+V_{res}$) and a negative residue signal ($-V_{res}$), respectively, during the hold mode, wherein the positive and negative residue signals ($+/-V_{res}$) comprise a differential residue signal in the pipelined converter. Moreover, the apparatus includes a first selection circuit that is arranged to couple a selected one of the first, second, and third capacitance circuits between the first input and the first output of the differential amplifier circuit in response to the output code during the hold mode. A second selection circuit is also included in the apparatus and is arranged to couple the other of the first, second, and third capacitor circuits between a respective hold reference signal and the first input of the differential amplifier circuit. The hold reference signals and the selected capacitor are determined by the output code. Furthermore, a third selection circuit is included that is arranged to couple a selected one of the fourth, fifth, and sixth capacitance circuits between the second input and the second output of the differential amplifier circuit in response to the output code during the hold mode. Additionally, a fourth selection circuit is included that is arranged to couple the other of the fourth, fifth, and sixth capacitor circuits between a respective hold reference signal and the second input of the differential amplifier circuit. The hold reference signals and the selected capacitor are determined by the output code.

I claim:

1. An apparatus for producing digital output signals from an analog input signal in a pipelined stage that includes a sample mode and a hold mode, the apparatus comprising:

a first capacitor circuit that is coupled to the analog input signal during the sample mode such that the first capacitor circuit is charged by the analog input signal;

a second capacitor circuit that is coupled to the analog input signal during the sample mode such that the second capacitor circuit is charged by the analog input signal;

a third capacitor circuit that is coupled to a circuit ground potential during the sample mode such that the third capacitor is discharged;

a comparator circuit that is coupled to the analog input signal, and first and second sampling reference signals that are pre-selected to minimize transition height errors, the comparator circuit providing an output code in response to the analog input signal and the first and second sampling reference signals, wherein the output code correspond to one of at least three operating regions for the analog input signal during the sample mode;

an amplifier circuit that is coupled to the first, second, and third capacitance circuits during the hold mode;

a first selection circuit that is arranged to couple a selected one of the first, second, and third capacitance circuits between an input and an output of the amplifier circuit in response to the output code during the hold mode; and a second selection circuit that is arranged to couple the other of the capacitor circuits between a respective hold reference signal and the input of the amplifier circuit, wherein the hold reference signals and the selected capacitor are determined by the output code, and the output of the amplifier circuit during the hold mode corresponds to a residue signal in a pipelined converter.

2. The apparatus of claim 1, wherein the capacitor circuits each have capacitance values that are substantially the same.

3. The apparatus of claim 1, wherein each of the hold reference signals correspond to one of the values of $+V_{ref}/2$ and $-V_{ref}/2$, wherein $V_{ref}$ corresponds to the absolute value of the maximum conversion range of the analog input signal.

4. The apparatus of claim 1, wherein the first and second sampling reference signals correspond to $+V_{ref}/4$ and $-V_{ref}/4$.

5. The apparatus as in claim 1, further comprising a fourth capacitor circuit that is coupled to the circuit ground potential during the sample mode such that the fourth capacitor is discharged, a third sampling reference signal that is coupled to the comparator circuit, wherein the comparator circuit is arranged to provide an output code in response to the analog input signal, and the first, second and third sampling reference signals such that the output code corresponds to one of at least four operating regions for the analog input signal during the sample mode, the first selection circuit is arranged to couple a selected one of the first, second, third and fourth capacitance circuits between an input and an output of the amplifier circuit in response to the output code, and the second selection circuit is arranged to couple the other of the capacitor circuits between a respective hold reference signal and the input of the amplifier circuit, wherein the hold reference signals and the selected capacitor are determined by the output code, and the output of the amplifier circuit during the hold mode corresponds to a residue signal in a pipelined converter.

6. The apparatus of claim 5, wherein the third sampling reference signal corresponds to the circuit ground potential.

7. The apparatus as in claim 1, wherein the output code includes a number of effective bits and each of the effective bits is associated with a corresponding operating region for the analog input signal during the sample mode.

8. An apparatus in claim 1, wherein the analog input signal is a differential signal and the residue signal is another differential signal.

9. A circuit for minimizing the effects of capacitor mismatch errors in a conversion code generated by a k-pipelined analog to digital converter in response to an analog input signal, the circuit comprising:

k pipeline stages that are arranged in sequence such that an input signal to each subsequent pipeline stage is provided by a residue signal from a preceding pipeline stage, each pipeline stage including a plurality of capacitors, a comparison circuit, an amplifier circuit, wherein one of the plurality of capacitors is coupled to a ground potential during a sampling mode, and one of the plurality of capacitors is selectively switched into a feedback position of the amplifier circuit during a hold mode, the comparison circuit is arranged to produce a plurality of digital code bits, and the amplifier provides the residue signal in response to the input signal such that the plurality of digital code bits correspond to an operating region of the input signal, and a plurality of transition points define the operating regions such that transition height errors that occur from capacitor mismatches are minimized; and a decoder logic circuit that is arranged to produce a conversion code in response to the plurality of digital code bits from each of the k pipeline stages.

10. A method for converting an analog input signal to a conversion code, in a converter with multiple pipelined stages, each pipelined stage including a plurality of capacitor circuits, comprising:

sampling the analog input signal from one of the analog input signal and an improved residue signal from a preceding one of the pipelined stages to produce a sampled analog signal, wherein at least one capacitor circuit of the plurality of capacitor circuits is coupled to a ground potential during sampling of the analog input signal;

comparing the sampled analog signal to transition points on a transfer curve, wherein the transition points are arranged to partition an analog input range into multiple operating regions;

providing a digital code in response to the comparison between the sampled analog signal and the transition points such that the digital code corresponds to a selected one of the multiple operating regions;

producing an improved residue signal in response to the digital code and the sampled analog input signal such that the improved residue signal corresponds to a point along the transfer curve in the selected one of the multiple operating regions; and computing the conversion code from the digital codes from each stage in the pipelined converter, such that offset margins in the transfer curve that occur at the transition points are retained, and transition height errors that occur at the transition points are eliminated.

11. A method as in claim 10, wherein the step of comparing the sampled analog signal to transition points includes comparing the sampled analog signal to a first transition point that corresponds to $V_{ref}/4$ and comparing the sampled analog signal to a second transition point that corresponds to $-V_{ref}/4$, and the transition points define three operating regions.

12. A method as in claim 10, wherein the step of comparing the sampled analog signal to transition points includes comparing the sampled analog signal to a first transition point that corresponds to $V_{ref}/2$, comparing the sampled analog signal to a second transition point that corresponds to zero, and comparing the sampled analog signal to a third transition point that corresponds to $-V_{ref}/2$ such that the transition points define four operating regions.

13. An apparatus for converting an analog input signal to a conversion code, in a converter with multiple pipelined stages, each pipelined stage including a plurality of capacitors means, the apparatus comprising:

a means for sampling that is arranged to sample the analog input signal from one of the analog input signal and an improved residue signal from a preceding one of the pipelined stages to produce a sampled analog signal, wherein one capacitor means of the plurality of capacitor means in the sampling pipelined stage is coupled to a ground potential during sampling of the analog input signal;

a means for comparing that is arranged to compare the sampled analog signal to transition points on a transfer curve, wherein the transition points are arranged to partition an analog input range into multiple operating regions;

a means for providing that is arranged to provide a digital code in response to the comparison between the sampled analog signal and the transition points such that the digital code corresponds to a selected one of the multiple operating regions;

a means for producing that is arranged to produce an improved residue signal in response to the digital code and the sampled analog input signal such that the improved residue signal corresponds to a point along the transfer curve in the selected one of the multiple operating regions; and a means for computing that is arranged to compute the conversion code from the digital codes from each stage in the pipelined converter, such that offset margins in the transfer curve that occur at the transition points are retained, and errors that occur at the transition points are minimized.

14. An apparatus as in claim 13, wherein the means for comparing includes a means for comparing that is arranged to compare the sampled analog signal to a first transition point that corresponds to $V_{ref}/4$ and a second means for comparing that is arranged to compare the sampled analog signal to a second transition point that corresponds to $-V_{ref}/4$, such that the first and second the transition points define three operating regions.

15. An apparatus as in claim 13, wherein the means for comparing includes a means for comparing that is arranged to compare the sampled analog signal to a first transition point that corresponds to $V_{ref}/2$, a second means for comparing that is arranged to compare the sampled analog signal to a second transition point that corresponds to zero, and a means for comparing that is arranged to compare the sampled analog signal to a third transition point that corresponds to $-V_{ref}/2$ such that the first, second, and third transition points define four operating regions.

16. An apparatus in claim 13, wherein the errors that are minimized include at least one of a transition height error, a gain error, and a pipeline stage saturation error that occur as a result of capacitor mismatches.

\* \* \* \* \*